United States Patent [19]
Okazaki

[11] Patent Number: 5,521,554
[45] Date of Patent: May 28, 1996

[54] HIGH-FREQUENCY BAND AMPLIFIER SYSTEM

[75] Inventor: Mitsunari Okazaki, Soma, Japan

[73] Assignee: Alps Electric Co., Ltd., Tokyo, Japan

[21] Appl. No.: 317,944

[22] Filed: Oct. 4, 1994

[30] Foreign Application Priority Data

Oct. 4, 1993 [JP] Japan .................. 5-273100

[51] Int. Cl.⁶ .................................................. H03F 3/191
[52] U.S. Cl. .................................................. 330/306; 333/193
[58] Field of Search .................................. 330/302, 306; 333/193, 194, 195, 196

[56] References Cited

U.S. PATENT DOCUMENTS 4,253,119  2/1981  Jones ..................... 333/194 X
4,316,220  2/1982  Muterspaugh et al. ......... 333/193 X
4,613,824  9/1986  Rinderle ........................... 330/302

FOREIGN PATENT DOCUMENTS 54-148415  11/1979  Japan .
63-232511   9/1988  Japan .

*Primary Examiner*—Steven J. Mottola
*Attorney, Agent, or Firm*—Guy W. Shoup; Patrick T. Bever

[57]  ABSTRACT

A high-frequency band amplifier system which is capable of containing the amount of ripple produced in the band passed by an SAW filter, and which is also capable of avoiding an increase in the noise factor. Such an amplifier system is constructed of a surface acoustic wave filter and a common-base connected transistor amplifier for amplifying the output from the surface acoustic wave filter.

12 Claims, 4 Drawing Sheets

HIGH-FREQUENCY BAND AMPLIFIER SYSTEM

BACKGROUND OF THE INVENTION

1. Field of the Invention

The present invention relates to a high-frequency band amplifier system using a surface acoustic wave filter (hereinafter referred to as "the SAW filter").

2. Description of the Related Art

When the impedance of the SAW filter is matched in relation to the impedances of a signal source and a load (hereinafter referred to as "impedance matching") in a high-frequency circuit incorporating the SAW filter, the amount of ripple in the band passed by the filter increases and fails to be put into a practical use. In order to avoid such an inconvenience, the circuit is generally constructed by mismatching the impedance of the SAW filter in relation to the impedances of a signal source and a load (hereinafter referred to as "impedance mismatching").

FIG. 4 shows a comparison of transmission characteristics within the band passed by the filter between the cases where the impedance matching is performed and the impedance mismatching is effected. FIG. 4(A) illustrates a diagram when the impedances of the signal source and the load are respectively matched in relation to the input and output impedances of the SAW filter, while FIG. 4(B) illustrates a diagram when the impedances of the signal source and the load are respectively mismatched in relation to the input and output impedances of the SAW filter. The impedance mismatching conditions are set as follows. The signal source impedance is set as one fourth of the input impedance at the input terminal of the SAW filter, while the load impedance is set as one fourth of the output impedance at the output terminal of the SAW filter. As seen in FIG. 4(A), the amount of ripple in the band is approximately 1.2 dB when the impedance matching is performed, while FIG. 4(B) shows that the ripple can be reduced to approximately 0.4 dB when the impedance mismatching is effected. In general, it is desired that the impedances of the signal source and the load are respectively several times smaller than the input and output impedances of the SAW filter.

When a high-frequency band transistor amplifier system is constructed using a filter, it is conventionally believed to be advantageous to use a common-emitter amplifier to improve the systems characteristics, such as the NF, the gain and the stability, and the like. This is also applied to a system in which a SAW filter is used.

FIG. 5 illustrates a conventional high-frequency band transistor amplifier system using the SAW filter. FIG. 5 shows a signal source 1, a SAW filter 2 and a common-emitter amplifier 3. As shown, the input impedance and the output impedance of the SAW filter 2 can be indicated by an equivalent circuit including parallel circuits $R_I$, $C_I$ and $R_O$, $C_O$, each containing an equivalent resistor and an equivalent capacitor. $L_I$ and $L_O$ are resonance inductances which allow, the SAW filter 2 to produce resonance with the equivalent capacitances $C_I$ and $C_O$. In view of this background, $R_I$ and the signal source resistor $R_S$ are allowed to be in a mismatched state, and $R_O$ and the load are also allowed to be in a mismatched state. Since the input impedance of the common-emitter amplifier 3, which is used as a load, is relatively high (approximately 12 k$\Omega$), a resistor $R_B$ used for impedance mismatching and having a small value of approximately 50$\Omega$, is inserted between the output terminal of the SAW filter 2 and the transistor amplifier. Since the high-frequency band circuit is constructed as described above, the load impedance in relation to the output impedance ($R_O$=200$\Omega$) of the SAW filter 2 is approximately 50$\Omega$ (the input impedance of the transistor amplifier is negligible), thus reducing the amount of ripple. The signal source resistance $R_S$ in relation to the input impedance ($R_I$=300$\Omega$) at the input terminal of the SAW filter 2 is set as 75$\Omega$, thereby realizing the impedance mismatching therebetween.

The noise factor (NF) of an amplifier will now be considered.

It has been theoretically substantiated that the NF of an amplifier is generally determined by the signal source impedance, the input impedance of the amplifier and the equivalent noise resistance peculiar to an amplifier element constituting the amplifier. The input impedance and the equivalent noise resistance are determined by the type of grounded transistor used in the amplifier, and consequently, the NF is determined by the signal source impedance on the whole. The NF of the common-emitter amplifier can be indicated by the curve A shown in FIG. 6, while the NF of the common-base connected transistor amplifier can be indicated by the curve B. The horizontal axis of the diagram shown in FIG. 6 indicates the signal source impedance. As is seen from the curve A, the NF of the common-emitter amplifier obtains a minimum value (approximately 1 dB) when the impedance viewed from the input terminal of the amplifier to the signal source is from 2 to 3 k$\Omega$. Such impedance conditions are referred to as "NF matching". Such a minimum value is much smaller than that obtained by performing NF matching using the common-base amplifier (approximately 5.3 dB when the signal source impedance is in a range from 100 to 200$\Omega$, on the curve B).

When the SAW filter is used, a resistor $R_B$ used for the impedance mismatching, having a small value (50$\Omega$), is inserted between the output terminal of the SAW filter and the transistor amplifier in order to reduce the amount of ripple as described above. Under such circuit conditions, the impedance viewed from the input terminal (base) of the transistor amplifier to the signal source is approximately 40$\Omega$, as shown in FIG. 7 (the parallel impedance consisting of the output impedance 200$\Omega$ of the SAW filter and the small resistance $R_B$ of 50$\Omega$). As a result, the actual NF of the common-emitter amplifier 3 is positioned near the point a (from 8 to 9 dB) on the curve A shown in FIG. 6, and it is understood that such a value significantly deviates from NF matching. That is, in the common-emitter amplifier using the SAW filter, NF matching cannot be achieved if an improvement is made to reduce the amount of ripple in the band passed by the filter, thus ending in a significant increase in the NF.

Conventionally, the impedance ratio of $R_I$ at the input terminal of the SAW filter 2 to the signal source resistance $R_S$ is set to be substantially equivalent to that of $R_O$ at the output terminal of the SAW filter 2 to the small resistance $R_B$, and accordingly, the mismatching loss produced at the input terminal of the SAW filter is substantially equivalent to that at the output terminal thereof. In general, the presence of a mismatching loss increases the NF. The SAW filter is known to have a relatively large insertion loss (approximately 13 dB), and consequently, an amplifier used as a load is connected to the SAW filter in order to compensate for such a loss. Thus, in the conventional transistor amplifier system, $R_S$ is approximately 75$\Omega$ and $R_I$ is 300$\Omega$, thereby causing a loss of approximately 2 dB, which directly gives rise to an increase in the NF. At the output terminal of the SAW filter, the NF is determined by the relationship between the amplifier and the signal source impedance, that is, the output impedance of the SAW filter, in relation to the amplifier, as shown in FIG. 6. As stated above, the mismatching loss produced at the output terminal of the SAW filter does not directly influence the NF.

FIG. 8 illustrates another example of a conventional amplifier system. In this example, a transistor amplifier 4 is balanced, and the other constructions are similar to those shown in FIG. 5. FIG. 8 also illustrates a resistor $R_B$ used for the impedance mismatching, a constant current source 5 and biasing power sources 6 and 7.

As has been discussed above, conventionally, a common-emitter amplifier is connected to the output terminal of the SAW filter. Hence, although such an amplifier is able to minimize the amount of ripple in the band passed by the filter, it is unable to achieve NF matching, thus ending in a considerable increase in the NF. Further, a loss caused by the impedance mismatching at the input terminal of the SAW filter is set to be substantially equivalent to that at the output terminal thereof, which also results in an increase in the NF. This produces a problem in that a transmitter/receiver for transmitting and receiving faint signals as well as normal signals has a narrow dynamic range.

SUMMARY OF THE INVENTION

Accordingly, in order to solve the above problems, an object of the present invention is to provide a high-frequency band amplifier system which is capable of containing the amount of ripple produced in the band passed by an SAW filter, without increasing the NF.

In order to achieve the above object, according to a first aspect of the present invention, there is provided a high-frequency band amplifier system comprising: a surface acoustic wave filter and a common-base amplifier for amplifying an output signal from the surface acoustic wave filter.

According to a second aspect of the present invention, there is provided a high-frequency band amplifier system comprising: a surface acoustic wave filter having an input terminal connected to a signal source; and an amplifier for amplifying an output signal from the surface acoustic wave filter, the internal impedance of the signal source and the input impedance of the surface acoustic wave filter being in a first mismatched state, and the output impedance of the surface acoustic wave filter and the input impedance of the amplifier being in a second mismatched state, wherein a mismatching loss produced by the first mismatched state is smaller than that produced by the second mismatched state.

According to the first aspect of the present invention, since the input impedance of the common-base amplifier used as a load for the SAW filter is low, such as a few dozens ohms impedance matching between the amplifier and the SAW filter, and NF matching can be realized without setting any condition. On the other hand, according to the second aspect of the present invention, the impedance mismatching loss at the input terminal of the SAW filter is smaller than that at the output terminal thereof, thus reducing the possibility of increasing the entire NF.

DESCRIPTION OF THE PREFERRED EMBODIMENTS

Figure 1:
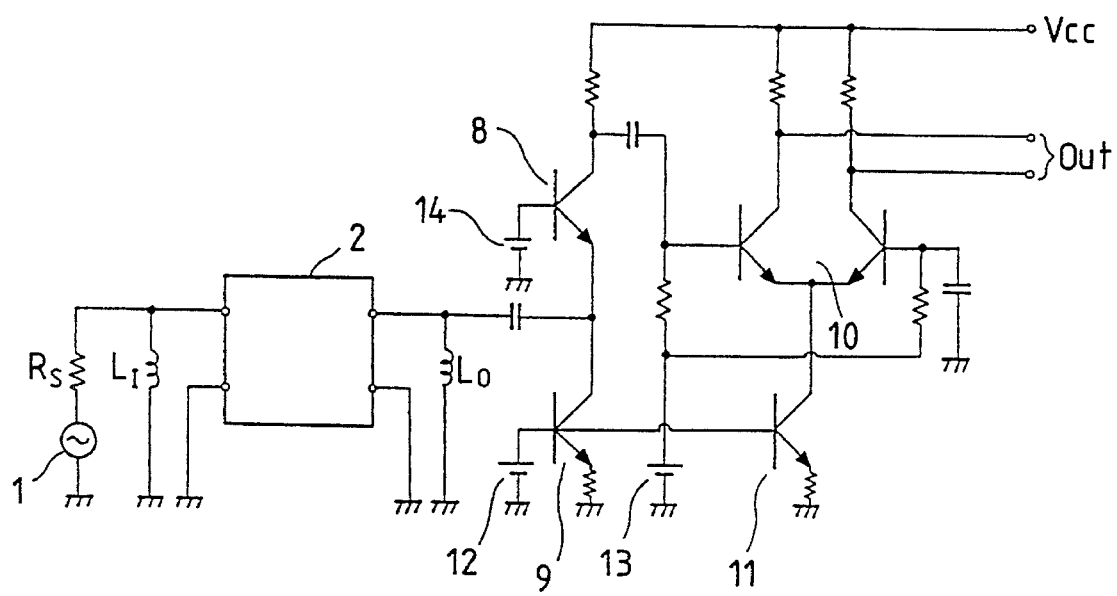
FIG. 1 is a circuit diagram of a high-frequency band amplifier system according to a first embodiment of the present invention.

A first embodiment of the present invention is shown in FIG. 1. Components shown in FIG. 1 being different from those shown in FIG. 5 will be explained. FIG. 1 shows a common-base amplifier 8, a constant current source 9 connected to the emitter of the amplifier 8, a differential amplifier 10, a constant current source 11 connected to the emitter of the differential amplifier 10, and biasing power sources 12–14. The output from the SAW filter 2 is connected to the emitter of the common-base connected transistor amplifier 8, and the collector of the amplifier 8 is connected to the base of a first transistor of the differential amplifier 10. Since the base of the second transistor of the differential amplifier 10 is grounded in a high-frequency manner (through a capacitor), the input into the base of the transistor is not balanced with respect to the second transistor so that the output signal from the common-base amplifier 8 is input into the differential amplifier 10 in an imbalanced manner. The output from the differential amplifier 10 is produced in a balanced manner so as to be supplied to the subsequent circuit (not shown). The input impedance of the common-base amplifier 8 is approximately 50Ω, which has been set as one fourth of the output impedance (approximately 200Ω) of the SAW filter 2. On the other hand, the impedance Rs of the signal source 1 is approximately 150Ω, which has been set as one half of the input impedance (approximately 300Ω) of the SAW filter 2. This indicates that the mismatching loss caused at the input terminal of the SAW filter 2 is smaller than that at the output terminal thereof.

Figure 5:
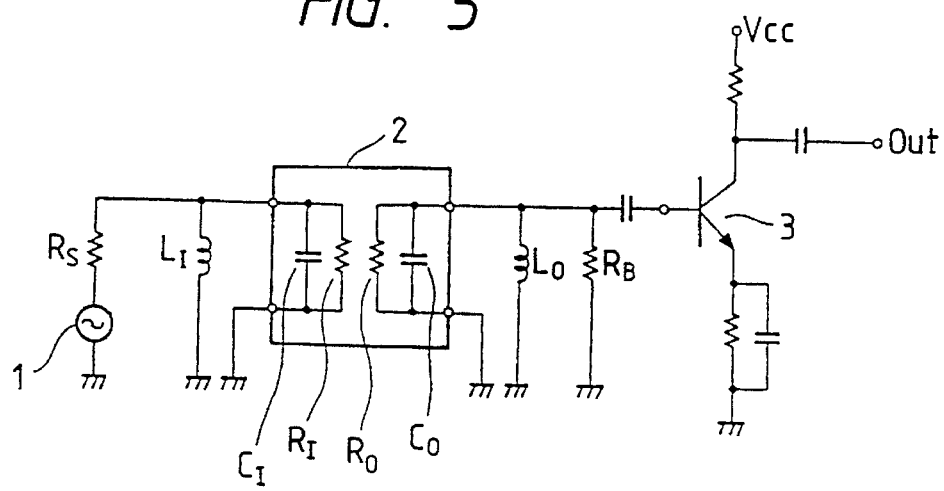
FIG. 5 is a circuit diagram of one example of a conventional high-frequency band amplifier system using an SAW filter.

The first embodiment constructed as described above differs from the conventional amplifier system shown in FIG. 5 in the following respects. The common-base amplifier 8 used as a load for the SAW filter 2 in the first embodiment is used in place of the common-emitter connected transistor amplifier 3 used in the conventional amplifier system. Also, the resistor $R_B$ used for the impedance mismatching in the conventional amplifier system has been omitted. Finally, the mismatching loss caused at the input terminal of the SAW filter 2 has been set to be smaller than that at the output terminal thereof.

Figure 2:
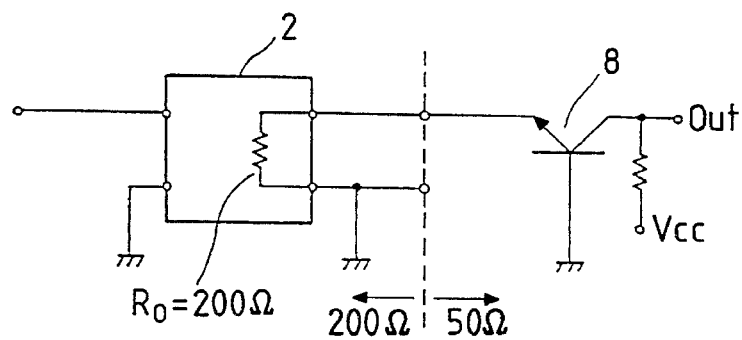
FIG. 2 is a circuit diagram illustrative of the impedance mismatching state brought about by a combination of an SAW filter and a common-base amplifier according to the present invention.
Figure 6:
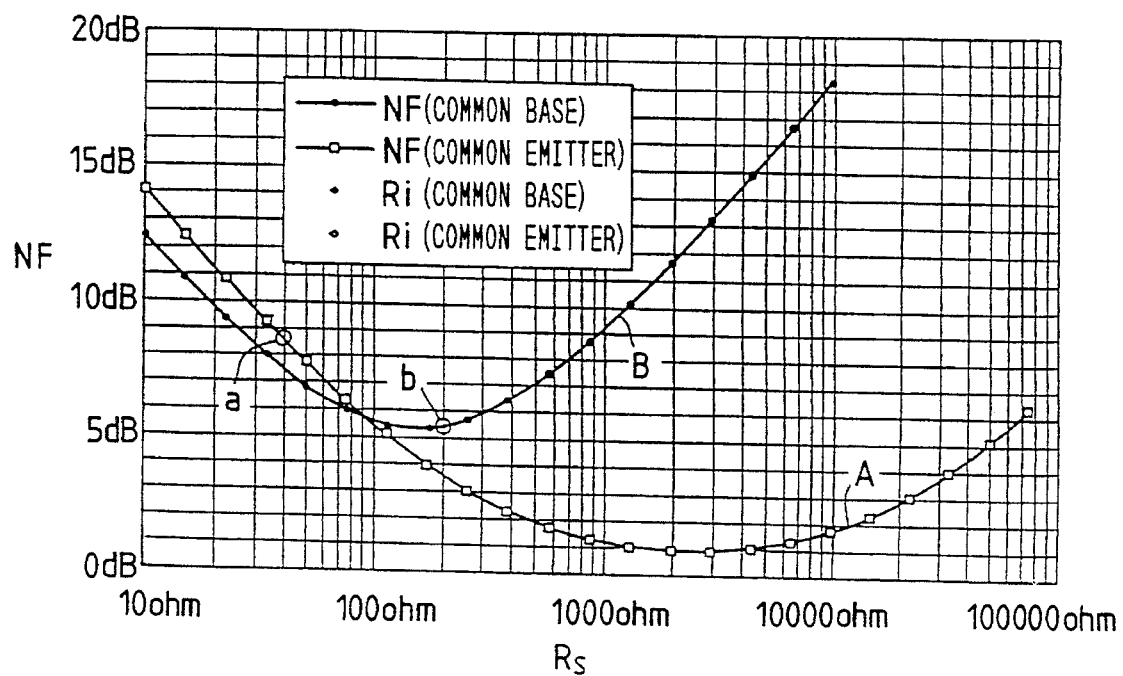
FIG. 6 is a diagram illustrative of typical NF characteristics of a common-emitter amplifier and a common-base amplifier.
Figure 7:
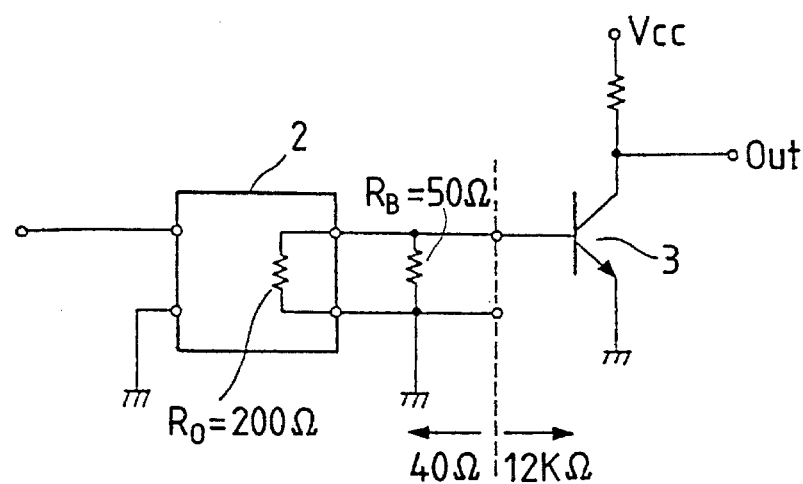
FIG. 7 is a circuit diagram illustrative of the impedance mismatching state brought about by a combination of a SAW filter and a common-emitter connected transistor amplifier according to an example of the conventional high-frequency band amplifier system.
Figure 8:
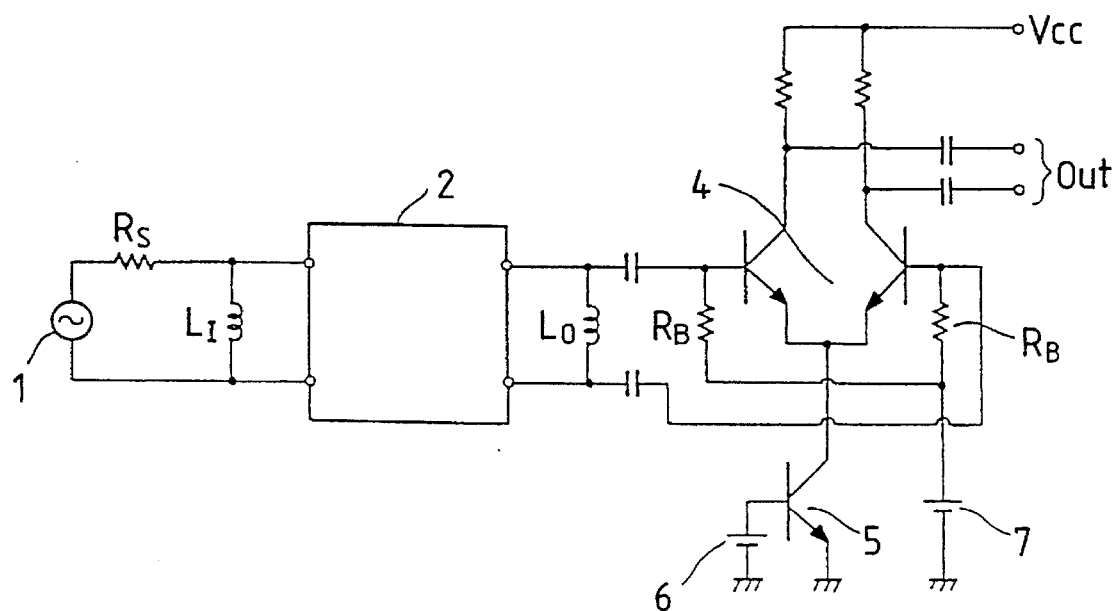
FIG. 8 is a circuit diagram of another example of a conventional high-frequency band amplifier system.

The relationship of the impedance between the SAW filter 2 and the amplifier 8 can be illustrated as indicated in FIG. 2. That is, the input impedance at the emitter of the common-base amplifier 8 used as a load for the SAW filter 2 is approximately 50Ω, while the impedance viewed from the emitter to the SAW filter 2 is approximately 200Ω. This relationship will be considered with respect to the NF shown in FIG. 6. The NF is positioned at the point b on the curve B when the signal source impedance of the common-base amplifier is 200Ω, the NF being approximately 5.3 dB. In other words, the common-base connected transistor amplifier is used as a load for the SAW filter 2 so as to contain the amount of ripple in the band passed by the filter and also realize NF matching in relation to the amplifier 8.

A description will now be given of influences on the NF due to the impedance mismatching loss. The signal source impedance $R_S$ is 150Ω, while the input impedance of the SAW filter 2 $R_O$ is 300Ω, from which fact results in a mismatching loss of approximately 0.5 dB. Such a loss is directly added to the input loss 13 dB of the SAW filter 2, thus increasing the NF by 0.5 dB. However, this is only a negligible value. On the other hand, a loss is certainly caused due to the mismatching between the output impedance of the SAW filter 2 and the input impedance of the common-base amplifier 8. However, this has very little influence on the NF. As is seen from FIG. 6, the NF matching of the signal source impedance in relation to the common-base connected transistor amplifier 8 is accomplished in a wide range from 100 to 300Ω. This fact substantiates that the amount of mismatching loss does not necessarily directly give rise to an increase in the NF.

Figure 3:
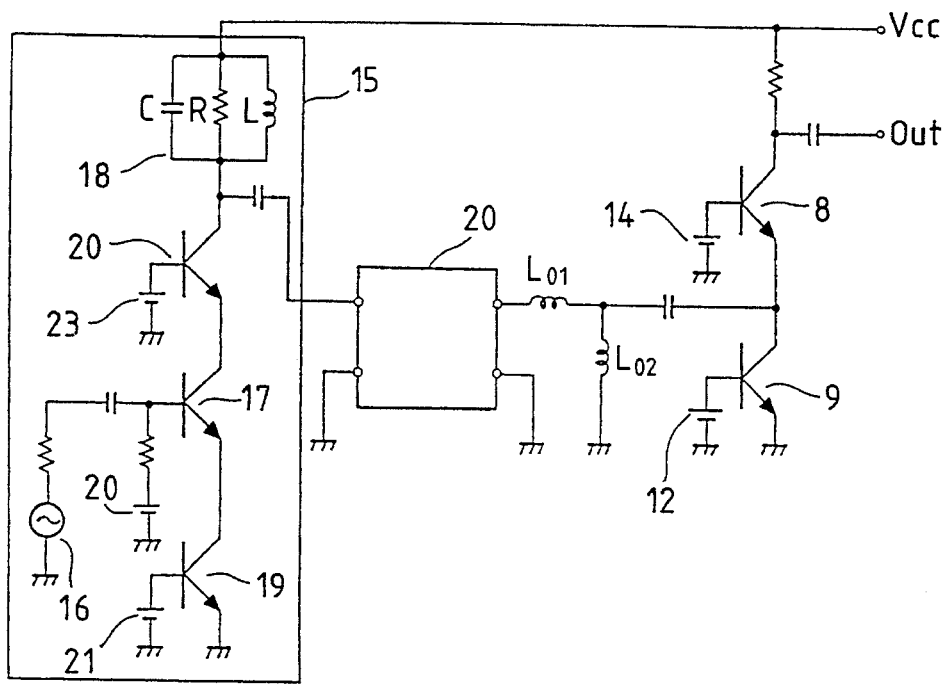
FIG. 3 is a circuit diagram of a high-frequency band amplifier system according to a second embodiment of the present invention.
Figure 4A:
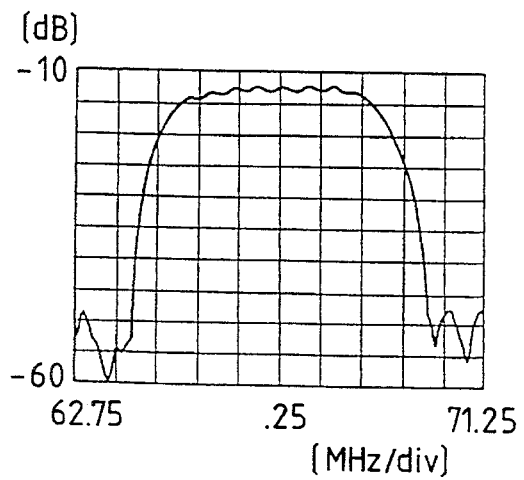
FIG. 4(A) illustrates transmission characteristics indicating a ripple in the band passed by a filter when the impedance matching is performed.
Figure 4B:
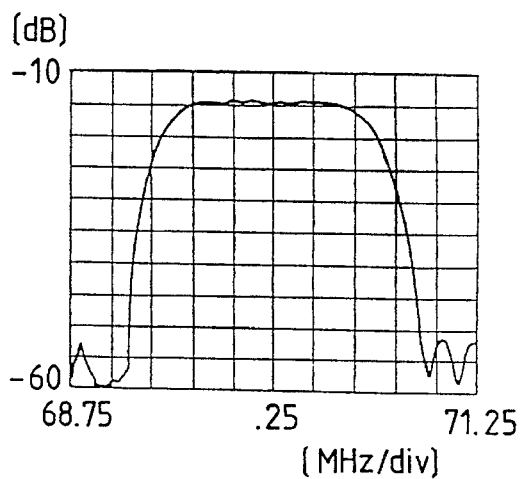
FIG. 4(B) illustrates transmission characteristics indicating a ripple in the band passed by a filter when the impedance mismatching is realized.

A second embodiment of the present invention is shown in FIG. 3. FIG. 3 illustrates a signal source system 15 for the SAW filter 2. The signal source system 15 further comprises a signal source 16, amplifiers 17 and 20, a tank circuit 18, a biasing transistor 19 for the transistor of the amplifier 17 and biasing power sources 21–23. L, C and R constituting the tank circuit 18 are capable of setting tuning frequencies and the signal source impedance in relation to the SAW filter 2 including the input impedance (equivalent input resistance and equivalent input capacitance) of the SAW filter 2. The tuning inductances $L_{O1}$, $L_{O2}$ at the output terminal of the SAW filter 2 determine the relationship between the output impedance of the SAW filter 2 and the input impedance of the common-base amplifier 8. For example, when the output impedance of the SAW filter 2 is much greater than 200Ω, it can be lowered by effecting a suitable tap-down of the two inductances $L_{O1}$, $L_{O2}$. Conversely, when the output impedance is smaller than 200Ω, it can be increased by effecting a suitable tap-up by changing the connections of $L_{O1}$ and $L_{O2}$. This can be achieved by a known technique.

As will be clearly understood from the foregoing description, the high-frequency band amplifier system of present invention offers the following advantages.

A common-base amplifier is used as a load for an SAW filter so as to be simply connected to the high-frequency band amplifier system. This creates a mismatched state between the output impedance of the SAW filter and the input impedance of the common-base amplifier, which mismatched state is required to reduce the amount of ripple produced in the band passed by the filter. In addition, the NF matching state in relation to the amplifier system can also be achieved, thus obtaining superior NF characteristics over a conventional amplifier system using a common-emitter amplifier.

Further, a mismatching loss produced between the SAW filter and a signal source in relation to the SAW filter is set to be smaller than that between the SAW filter and the amplifier used as a load for the SAW filter, thereby enabling a decrease in the NF.

What is claimed is:

1. A high-frequency band amplifier system comprising:

a surface acoustic wave filter having an output terminal;

a common-base amplifier connected to the output terminal for amplifying an output signal from said surface acoustic wave filter and for generating an amplified output signal; and a differential amplifier including first and second transistors, each of the first and second transistors having a base connected to receive the amplified output signal;

wherein the amplified output signal is transmitted to the first and second transistors in an imbalanced manner.

2. A high-frequency band amplifier system comprising:

a surface acoustic wave filter connected to a signal source and having an output terminal; and a common-base amplifier having an emitter connected to the output terminal of the surface acoustic wave filter for amplifying an output signal from said surface acoustic wave filter, wherein an internal impedance of said signal source is less than an input impedance of said surface acoustic wave filter, thereby producing a first mismatched state, and an output impedance of said surface acoustic wave filter is greater than an input impedance of said common-base amplifier, thereby producing a second mismatched state; and wherein a mismatching loss produced by said first mismatched state is smaller than a mismatching loss produced by said second mismatched state.

3. A high-frequency band amplifier system according to claim 1, wherein an input impedance at an emitter of said common-base amplifier is smaller than an impedance viewed from said emitter to said surface acoustic wave filter.

4. A high-frequency band amplifier system, comprising:

a surface acoustic wave filter connected to a signal source and having an output terminal; and an amplifier connected to the output terminal for amplifying an output signal from said surface acoustic wave filter, wherein an internal impedance of said signal source is less than an input impedance of said surface acoustic wave filter, thereby producing a first mismatched state, and an output impedance of said surface acoustic wave filter is greater than an input impedance of said amplifier, thereby producing a second mismatched state;

wherein a mismatching loss produced by said first mismatched state is smaller than a mismatching loss produced by said second mismatched state; and wherein an inductance is connected to the output terminal of said surface acoustic wave filter in series with said amplifier so as to cancel an equivalent output capacitance of said surface acoustic wave filter and also to set the output impedance of said surface acoustic wave filter and the input impedance of said amplifier in a mismatched state.

5. A high-frequency band amplifier system, comprising:

a surface acoustic wave filter connected to a signal source and having an output terminal; and an amplifier connected to the output terminal for amplifying an output signal from said surface acoustic wave filter, wherein an internal impedance of said signal source is less than an input impedance of said surface acoustic wave filter, thereby producing a first mismatched state, and an output impedance of said surface acoustic wave filter is greater than an input impedance of said amplifier, thereby producing a second mismatched state;

wherein a mismatching loss produced by said first mismatched state is smaller than a mismatching loss produced by said second mismatched state;

wherein said amplifier is a common-base amplifier having an emitter connected to the output terminal of the surface acoustic wave filter; and wherein an input impedance at the emitter of said common-base amplifier is smaller than an impedance viewed from said emitter to said surface acoustic wave filter.

6. A high-frequency band amplifier system, comprising:

a surface acoustic wave filter connected to a signal source and having an output terminal; and an amplifier connected to the output terminal for amplifying an output signal from said surface acoustic wave filter, wherein an internal impedance of said signal source is less than an input impedance of said surface acoustic wave filter, thereby producing a first mismatched state, and an output impedance of said surface acoustic wave filter is greater than an input impedance of said amplifier, thereby producing a second mismatched state;

wherein a mismatching loss produced by said first mismatched state is smaller than a mismatching loss produced by said second mismatched state; and wherein an inductance is connected to the output terminal of said surface acoustic wave filter in parallel with said amplifier so as to cancel an equivalent output capacitance of said surface acoustic wave filter and also to set the output impedance of said surface acoustic wave filter and the input impedance of said amplifier in a mismatched state.

7. A high-frequency band amplifier system, comprising:

a surface acoustic wave filter connected to a signal source and having an output terminal; and an amplifier connected to the output terminal for amplifying an output signal from said surface acoustic wave filter, wherein an internal impedance of said signal source is less than an input impedance of said surface acoustic wave filter, thereby producing a first mismatched state, and an output impedance of said surface acoustic wave filter is greater than an input impedance of said amplifier, thereby producing a second mismatched state;

wherein a mismatching loss produced by said first mismatched state is smaller than a mismatching loss produced by said second mismatched state; and wherein an inductance is connected to the output terminal of said surface acoustic wave filter in series and in parallel with said amplifier so as to cancel an equivalent output capacitance of said surface acoustic wave filter and also to set the output impedance of said surface acoustic wave filter and the input impedance of said amplifier in a mismatched state.

8. The high-frequency band amplifier system according to claim 1, wherein the common-base amplifier comprises:
a transistor having an emitter connected to the output terminal of the surface acoustic wave filter, and
a collector connected to the differential amplifier; and wherein the high-frequency band amplifier system further comprises a constant current source connected to the emitter.

9. The high-frequency band amplifier system according to claim 8, wherein the first and second transistors of the differential amplifier respectively include first and second emitters; and wherein the high-frequency band amplifier system further comprises a constant current source connected to the first and second emitters.

10. A high-frequency band amplifier system comprising:

a surface acoustic wave filter connected to a signal source and having an output terminal; and a common-base amplifier having an emitter connected to the output terminal of the surface acoustic wave filter for amplifying an output signal from said surface acoustic wave filter, wherein an internal impedance of said signal source is one-half of an input impedance of said surface acoustic wave filter, thereby producing a first mismatched state, and an output impedance of said surface acoustic wave filter and an input impedance of said common-base amplifier are in a second mismatched state; and wherein a mismatching loss produced by said first mismatched state is smaller than a mismatching loss produced by said second mismatched state.

11. The high-frequency band amplifier system, comprising:

a surface acoustic wave filter connected to a signal source and having an output terminal; and an amplifier connected to the output terminal for amplifying an output signal from said surface acoustic wave filter, wherein an internal impedance of said signal source is one-half of an input impedance of said surface acoustic wave filter, thereby producing a first mismatched state, and an output impedance of said surface acoustic wave filter and an input impedance of said amplifier are in a second mismatched state;

wherein a mismatching loss produced by said first mismatched state is smaller than a mismatching loss produced by said second mismatched state; and wherein the input impedance of the amplifier is one-fourth of the output impedance of the surface acoustic wave filter.

12. The high-frequency band amplifier system according to claim 11, wherein the internal impedance of the signal source is approximately 150Ω, the input impedance of the surface acoustic wave filter is approximately 300Ω, the output impedance of the surface acoustic wave filter is approximately 200Ω, and the input impedance of the amplifier is approximately 50Ω.

* * * * *